(12) United States Patent
Chen (10) Patent No.: US 7,009,882 B2
(45) Date of Patent: Mar. 7, 2006

(54) BIT SWITCH VOLTAGE DROP COMPENSATION DURING PROGRAMMING IN NONVOLATILE MEMORY

(75) Inventor: Chung Zen Chen, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 21 days.

(21) Appl. No.: 10/792,120

(22) Filed: Mar. 3, 2004

(65) Prior Publication Data

US 2005/0195657 A1 Sep. 8, 2005

(51) Int. Cl.
*G11C 16/04* (2006.01)
(52) U.S. Cl. .............................. 365/185.18; 365/185.2; 365/189.09
(58) Field of Classification Search ........... 365/185.18, 365/189.09, 226, 185.2
See application file for complete search history.

(56) References Cited

U.S. PATENT DOCUMENTS

| 5,576,991 | A | | 11/1996 | Radjy et al. |
| 5,642,311 | A | | 6/1997 | Cleveland et al. |
| 5,706,240 | A | * | 1/1998 | Fiocchi et al. .............. 365/226 |
| 5,790,466 | A | * | 8/1998 | Hotta .................... 365/185.25 |
| 6,046,932 | A | | 4/2000 | Bill et al. |
| 2005/0226051 | A1 | * | 10/2005 | Bedarida et al. ........ 365/185.18 |

* cited by examiner

*Primary Examiner*—Huang Hoang
(74) *Attorney, Agent, or Firm*—Duane Morris LLP (57) ABSTRACT

A method is provided of regulating a supply voltage for providing a bit line voltage in a semiconductor memory device where the bit line voltage is provided to memory cells in a bit line from the supply voltage through a bit switch. A bit line current provided to the memory cells is detected. The supply voltage is adjusted responsive to the deducted bit line current to at least partially compensate for a voltage drop across the bit switch where the voltage drop is dependent at least in part on the bit line current.

12 Claims, 7 Drawing Sheets

BIT SWITCH VOLTAGE DROP COMPENSATION DURING PROGRAMMING IN NONVOLATILE MEMORY

FIELD OF THE INVENTION

The present invention relates to an integrated circuit memory including an array of memory cells and circuitry for compensation for voltage drops during programming.

BACKGROUND OF THE INVENTION

Figure 1:
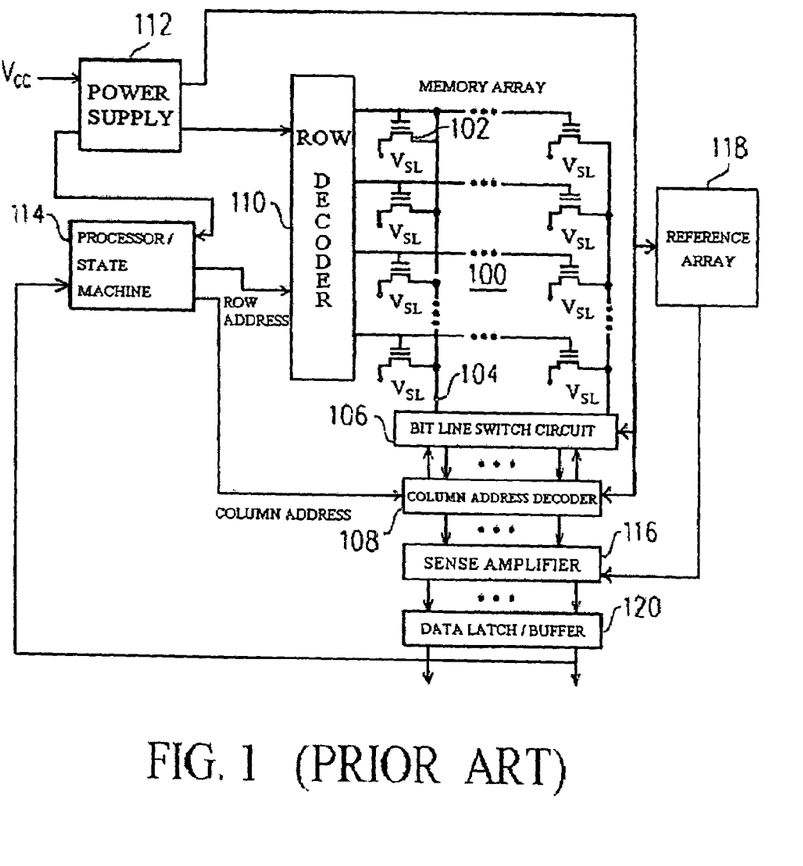
FIG. 1 shows a typical prior art configuration for an integrated circuit including a flash EEPROM memory array and circuitry enabling programming, erasing, reading and overerase correction in the array.

FIG. 1 shows a typical configuration for an integrated circuit including a flash EEPROM memory array 100 and circuitry enabling programming, erasing, reading, and overerase correction for memory cells in the array 100. The flash EEPROM array 100 is composed of individual cells, such as cell 102. Each cell has a drain connected to a bitline, such as bit line 104, each bitline being connected to a bitline switch circuit 106 and column decoder 108. Sources of the array cells are connected to each other and VSL, which is the common source signal, while their gates are each connected by a wordline to a row decoder 110.

The row decoder 110 receives voltage signals from a power supply 112 and distributes the particular voltage signals to the wordlines as controlled by a row address received from a processor or state machine 114. Likewise, the bitline switch circuit 106 receives voltage signals from the power supply 112 and distributes the particular voltage signals to the bitlines as controlled by a signal from the processor 114. Voltages provided by the power supply 112 are provided as controlled by signals received from processor 114.

The column decoder 108 provides signals from particular bitlines to sense amplifiers or comparators 116 as controlled by a column address signal received from processor 114. The power supply 112 supplies voltages to column decoder 108 and bit lines 104. The sense amplifiers 116 further receive a signal from reference cells of reference array 118. With signals from the column decoder 108 and reference array 118, the sense amplifiers 116 then each provide a signal indicating a state of a bitline relative to a reference cell line to which it is connected through data latches or buffers 120 to processor 114.

To program a cell in the flash memory array 100, high gate-to-source voltage pulses are provided to the cell from power supply 112 while a source of the cell is grounded. For instance, during programming multiple gate voltage pulses typically of 10 V are each applied for approximately three to six microseconds to a cell, while a drain voltage of the cell is set to 4.5 V and its source is grounded. The large gate-to-source voltage pulses enable electrons flowing from the source to drain to overcome an energy barrier to produce "hot electrons," some of which are accelerated across a thin dielectric layer enabling the electrons to be driven onto a floating gate of the cell. This programming procedure, termed "hot electron injection" results in an increase of a threshold voltage for the cell, the threshold being the gate-to-source voltage required for the cell to conduct.

To erase a cell in the flash memory array 100, a procedure known as Fowler-Nordheim tunneling is utilized wherein relatively high negative gate-to-source voltage pulses are applied for a few tenths of a second each. For instance, during erase multiple gate voltage pulses of −10 V are applied to a cell, while a source of the cell is set to 5.5 V and its drain is floating. The large negative gate-to-source voltage pulses enable electrons to tunnel from the floating gate of a cell reducing its threshold.

After erasure, there is a concern with "overerase." Over-erased cells have a threshold voltage that is too low and provide leakage current even when the gate-to-source voltage is at 0V. The cell leakage will form a non-negligible bit line current, which leads to reading and programming errors. Therefore, overerase correction is performed to reduce this bit line current. During overerase correction, all of the cells on a bit line in the flash memory array 100 have the same gate-to-source voltage with the source grounded. The drain voltage of the cell is set to around 5V. Again, hot electrons will be injected into the floating gate to raise the threshold voltages of the cells.

During programming, the bit line current of a bit line is composed of a cell current with the cell biased at programming condition and any cell currents provided by the unselected cells from the bit line. In general, the unselected cells have the gate-to-source voltage at ground level. During overerase correction, the bit line current is composed of all of the cell currents coming from all of the cells connected to the bit line. If overerase correction is done by bit line, all of the cells have equal gate-to-source voltages. If the overerase correction is done by a cell, the selected cell will have a different gate-to-source voltage from the other cells.

To represent a data bit, the floating gate of a cell is programmed or erased as described above. In a programmed state, the threshold voltage of a cell is typically set at greater than 5.0 volts, while the threshold voltage of a cell in an erased state is typically limited below 3.0 volts. To read a cell, a control gate voltage between 3.0 and 6.5 volts, typically 5 V, is applied. The 5 V read pulse is applied to the gate of an array cell as well as a cell in reference array 118 having a threshold near 3.5 V. In a programmed state with an array cell in array 100 having a threshold above 5.0 V, current provided by the reference cell with a threshold of 3.5 V will be greater indicating a programmed cell exists. In an erased state with a threshold of a cell in array 100 below 3.0 V, current provided by the array cell will be greater than the reference cell with a threshold of 3.5 V indicating an erased cell. To verify programming or erase, a read voltage is similarly applied to both a cell in the array and to cells in the reference array 118. For programming, a reference cell having a threshold of 5.0 V is used for a comparison, while for erase, a reference cell having a threshold of 3.0 V is used for comparison.

Figure 2:
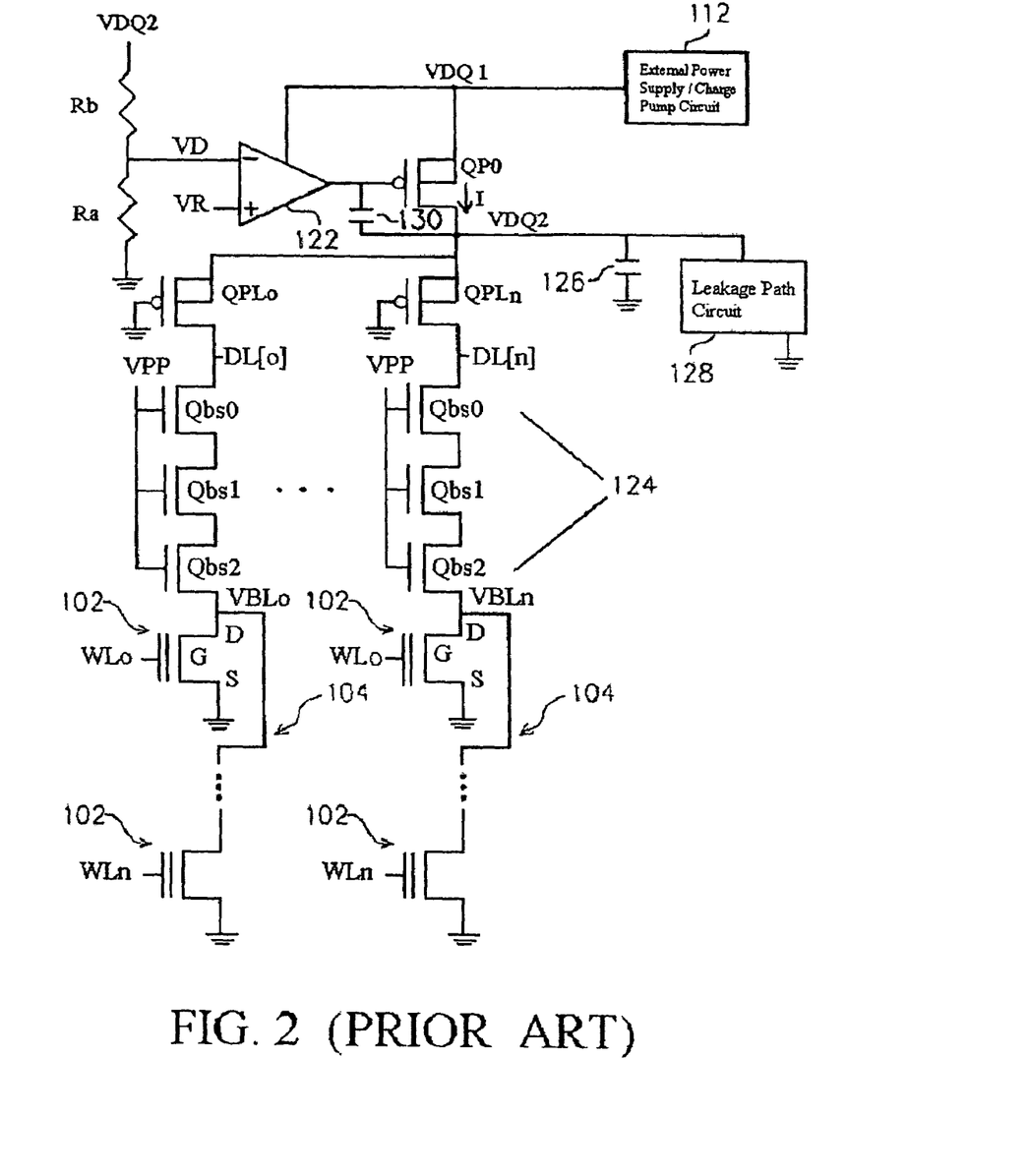
FIG. 2 illustrates prior art circuitry for providing a bit line voltage for programming and overerase correction to cells in a flash EEPROM memory array.

FIG. 2 is a circuit diagram of a portion of a flash memory, specifically illustrating two bit lines 104 each including two cells 102 and associated circuitry for generating bit line voltages VBL (shown as VBLo through VBLn) at the respective drains of cells 102 during programming and overerase correction. The common source line is shown grounded. Although only two bit lines 104 and two word lines are illustrated, it should be understood that any number of bit lines and words lines, and thus any number of cells, may be included in a memory array. Respective word line signals WLo through WLn are coupled to the control gates of cells 102. There are multiple bit lines selected by the column decoder (FIG. 1), which activate bit switches 124 associated with each bit line. Once a corresponding bit switch 124 is turned on, the corresponding bit line 104 is activated and the cell 102 is activated via the word line signal.

The memory array also typically includes multiple I/Os, such as eight I/Os in byte mode and 16 I/Os in word mode. Each I/O includes multiple bit lines 104 and one bit line is selected from each I/O for reading or programming, i.e., one bit line each is selected from 8 I/Os in byte mode (for a total of 8 bit lines and eight bits) and one bit line each is selected from 16 I/Os in word mode (for a total of 16 bit lines and 16 bits) for reading or programming. Each I/O corresponds to one internal data line signal, DL (shown as DL[0] through DL[n]), and multiple bitlines. Signal DL[n] is a global signal shared by many local bit lines with a common I/O, and DL[0] is a global signal shared by many local bit lines with a common I/O, although FIG. 2 illustrates only one bit line 104 per I/O. If a "0" is to be programmed to a selected cell 102 from a selected bit line 104 from a selected I/O, the respective PMOS QPL associated with the I/O is turned on. If "1" is to be programmed to the cell, the corresponding PMOS QPL from the I/O is turned off.

Power supply 112 (also shown in FIG. 1) may include a charge pump circuit or external power supply to supply the bit line current on a bit line needed during programming or overerase correction. The supply voltage VDQ1 is regulated to a target drain voltage value VDQ2 by, for example, differential amplifier 122. Bit switches 124, illustrated as pass gate transistors QBS0, QBS1, QBS2, are turned on by being biased to a high voltage level VPP by the addressed column decoder 108 and transfer the voltage of VDQ2 to the local bit line 104. In the illustrated example, each bit switch 124 includes three MOS pass transistors, but the number of pass transistors can vary from chip design to chip design.

The target value for voltage VDQ2 is set to ((Ra+Rb)/Ra)*VR. VR is a reference voltage provided by, for example, a reference voltage sub-circuit (not shown). A capacitor 126 is coupled between node VDQ2 and ground. This capacitor reduces the variation in VDQ2 when its source, VDQ1, is pumped. A leakage path circuit discharges VDQ2 once VDQ2 is over the target value, particularly during the time when VDQ2 is initially generated by the charge pump circuit, to prevent overshoot. A capacitor 130 is also connected between the gate of PMOS QP0 and node VDQ2. Capacitor 130 responses VDQ2 to QP0 in real time. The bit switches 124 are shown biased with a high voltage level VPP to allow the passing of VDQ2 to local bit lines during programming or overerase connection. The transistor size of the bit switch 124 is typically limited to save size.

During operation, there is a voltage drop across the bit switch 124 and PMOS QPL of each bit line when current flows therethrough. The magnitude of the voltage drop depends on the magnitude of the current through each cell 102, i.e., the larger the bit line current, the larger the voltage drop. This voltage drop decreases the local bit line voltage VBL (shown as VBLo through VBLn in FIG. 2) to below the target level VDQ2. The programming capability is significantly reduced during the initial programming stage because of the increased current in cells 102. Overerase correction is also degraded. As a cell is gradually programmed, the cell gains electrical charge and the cell current decreases gradually. The local VBL raises to approach VDQ2 as the local bit line current decreases.

The voltage drop of VBL also has an impact on overerase correction. The efficiency of overerase correction is reduced significantly and may result in failure, i.e., the cell cannot be overerase corrected successfully in the limited time duration set by design.

The circuit programming technique illustrated in FIG. 2 and described above does not provide a fixed VBL during programming of each cell 102. If VDQ2 is designed high to compensate for the voltage drop across bit switches 124, there are reliability concerns when the bit line current is reduced through programming or overerase correction. The reliability concerns include stressing out the interface state and degrading the endurance cycle of the cell. If VBL is raised too close to VDQ2, VBL can cause a soft program on non-selected cells on the selected bit line. Generated hot holes impact the Si—$SiO_2$ interface and generate interface states. The interface states impact cell threshold voltage and change the erasing characteristics of the cell as well as programming.

Therefore, there remains a need for a circuit and methodology for providing a bit line voltage to a memory cell or cells that is insensitive to the cell current.

SUMMARY OF THE INVENTION

A method is provided of regulating a supply voltage for providing a bit line voltage in a semiconductor memory device where the bit line voltage is provided to memory cells in a bit line from the supply voltage through a bit switch. A bit line current provided to the memory cells is detected. The supply voltage is adjusted responsive to the detected bit line current to at least partially compensate for a voltage drop across the bit switch where the voltage drop is dependent at least in part on the bit line current.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 3:
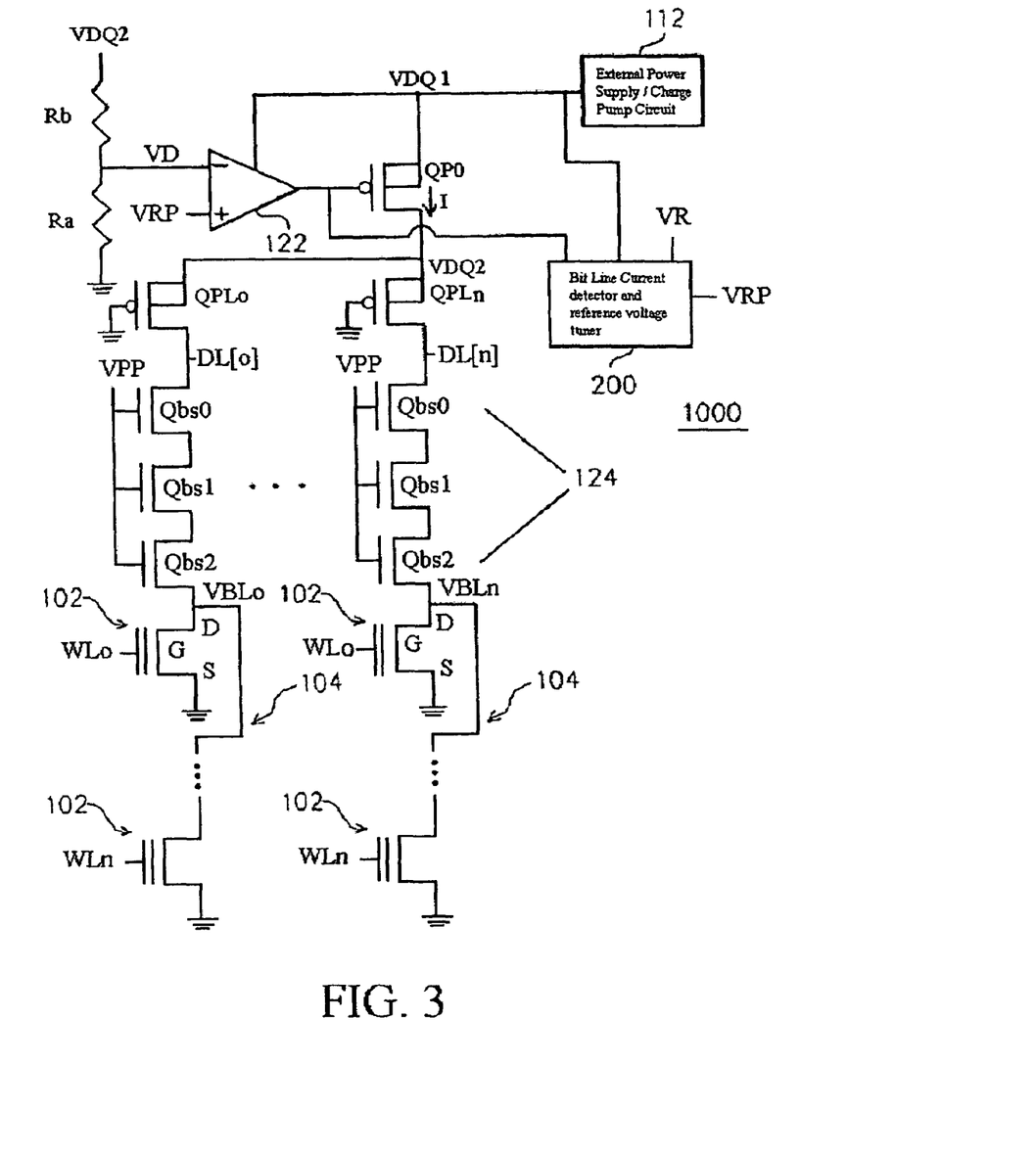
FIG. 3 illustrates a circuit design for providing a fixed bitline voltage.

FIG. 3 illustrates a circuit for providing a bit line voltage VBL to memory cells 102 in bit lines 104 that is substantially insensitive to changes in bit line current. The schematic of FIG. 3 is the same as the circuit schematic of FIG. 2, and like components are referred to with like references, except capacitors 126 and 130 and leakage path circuit 128 are not shown and the array 1000 includes bit line current detector and reference voltage tuner circuit 200 (hereinafter Detector and Tuner Circuit 200), which provides reference voltage VRP for differential amplifier 122. Detector and Tuner Circuit 200 detects the total bit line current I provided to cells 102 from transistor QP0 and adjusts the level of reference voltage VRP according to the magnitude of the total bit line current I to compensate for voltage drops across the bit switches 124 and I/O selection transistors QPL. The reference voltage VRP is input to the differential amplifier 122 to control the level of VDQ2 and thus the level of the local bit line voltages VBL. When a large total bit line current flows through PMOS QP0, VRP is raised to raise VDQ2, thereby countering the corresponding larger voltage drop across bit switches 124 and raising the local VBL levels. This approach is illustrated in more detail in the embodiment of FIG. 4.

Figure 4:
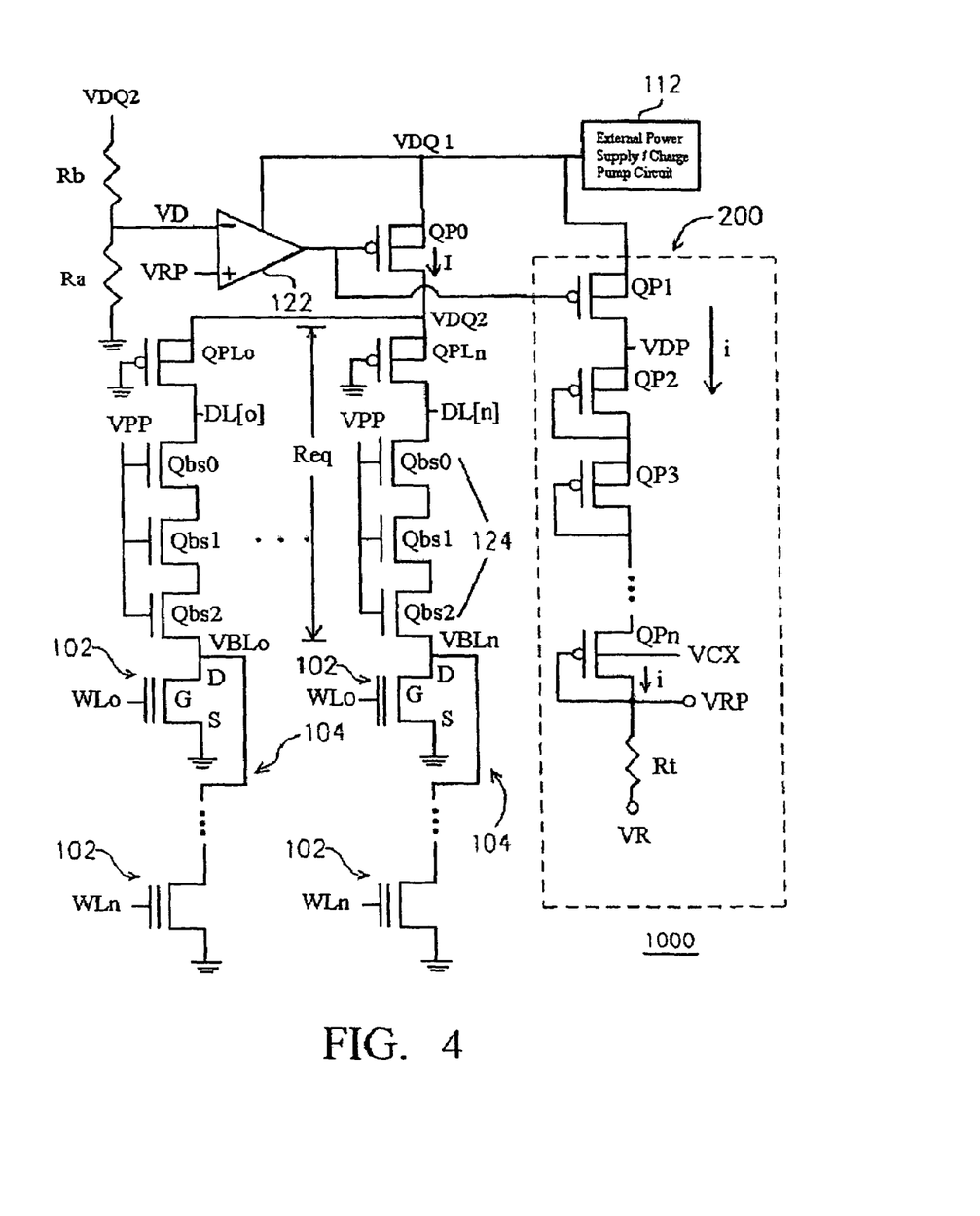
FIGS. 4–7 illustrate embodiments of the circuit design of FIG. 3.

Referring to FIG. 4, the Detector and Tuner Circuit 200 includes a current mirror circuit, such as a small PMOS transistor QP1, that mirrors the total bit line current I with a fixed reduction ratio M. The reduced current i equals I (total bit line current)/M. In one embodiment, M is selected to be between about 10 to 50. A resistor Rt (which is preferably tunable as discussed below) is coupled between a fixed reference voltage VR and the current mirror to add voltage i*Rt to VR, thereby providing tuned reference voltage VRP, which is dependent on fixed voltage VR and the total bit line current I. In essence, voltage VRP includes a fixed component (VR) and a variable component (i*Rt) responsive to changes in total bit line current I.

As noted above, reference voltage VRP is used to control the level of VDQ2 through differential amplifier 122. PMOSs QP2 through QPN of Detector and Tuner circuit 200 may be utilized to raise the voltage VDP to be close to VDQ2, making mirror QP1 operate in the same bias condition as QP0 and close to a perfect mirror. Because VRP is dependent in part on the total bit line current I, a large total bit line current I produces a proportionately large voltage addition to VR, i.e., in the amount of i*Rt (or (I/M)*Rt). This voltage addition is represented in VDQ2 and compensates for voltage drops across the voltage switches in activated bit lines, particularly at the initial programming stage when VBL can drop below its target value because of large voltage drops. As cell current decreases through programming or overerase correction, total bit line current I decreases, causing a decrease in mirrored current i, causing a decrease in voltage i*Rt added to VR, and thus voltages VRP and VDQ2, thereby preventing stressing of cells 104. The determination of PMOS size and the resistance value of Rt in circuit 200 are discussed below.

Assume initially that multiple bit lines 104 from multiple I/Os are modeled as a single bit line. The equivalent resistance of the multiple, parallel bit switches 124 and PMOSs QPL that are active during any one programming event is Req. The total current I flows through Req. Assuming VD=VRP, then (Ra/(Ra+Rb))*VDQ2=VRP. VRP also equals (I/M)*Rt+VR. VDQ2 is also equal to VBL+I*Req. Therefore, ((Ra/(Ra+Rb))*(VBL+I*Req)=VR+(I/M)*Rt. The bit line voltage VBL is typically set equal to ((Ra+Rb)/Ra)*VR, which is a fixed voltage. From this equation, it is known that ((Ra/(Ra+Rb))*I*Req=(I/M)*Rt. Therefore, Rt= ((M*Ra)/(Ra+Rb))*Req. Assuming further the programming condition where only one cell is being programmed, Req can be set to Req/cell—the equivalent resistance of QPL and bit switch 124 from a selected bit line 104. Transistors QP2 through QPn are preferably sized large enough to have negligible resistance compared with Rt.

It is preferred that the voltage at node VDP be near VDQ2, thereby providing close to a theoretically perfect current mirror, but this is not a requirement. Additional PMOS transistors QP2 through QPn can be added between node VRP and node VDP to raise the voltage VDP close to VDQ2 and thereby place QP1 in a bias condition similar to QP0. The electrical path between nodes VDP and VRP must be turned on, thereby limiting the number of PMOSs used in Detector and Tuner Circuit 200. The n-well bias of the PMOS QPn connected to node VRP must be a voltage higher than VRP because the PMOS n-well of QPn must have a higher voltage than its source and drain to avoid turning on the source p-n junction or drain p-n junction. This voltage is referenced as voltage VCX.

Figure 5:
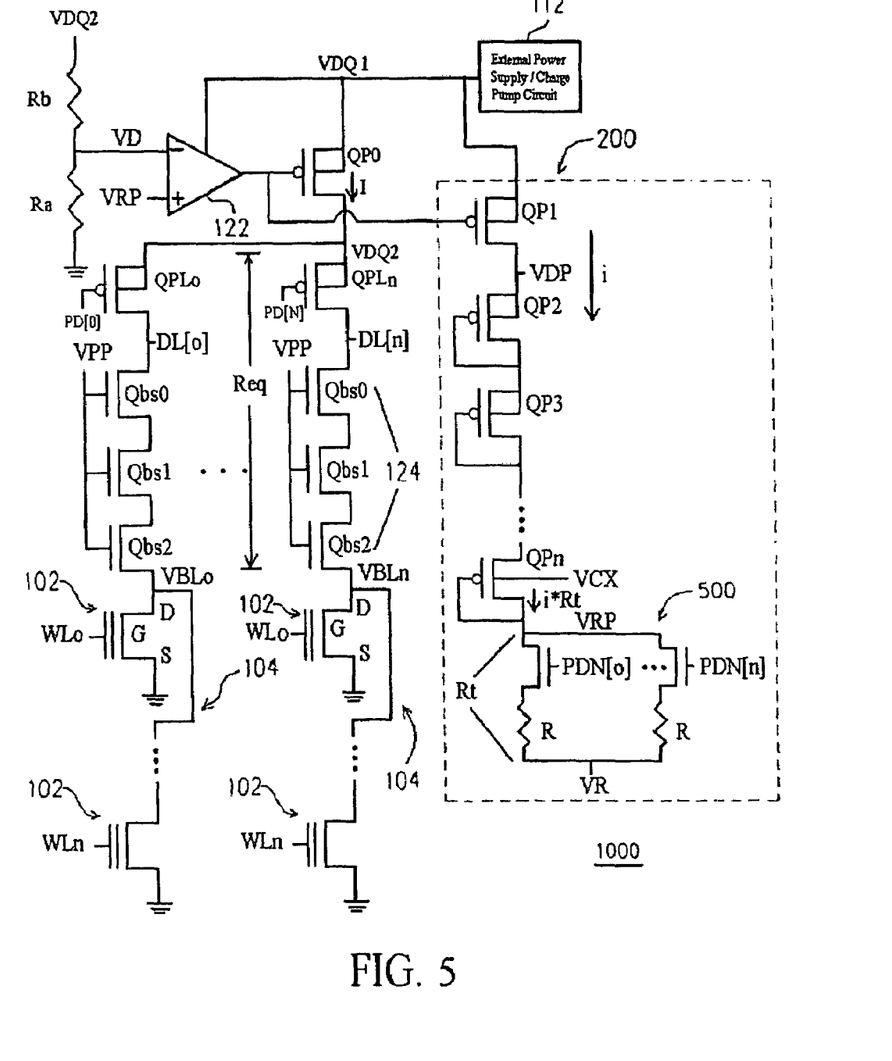

The total bit line current I decreases from the initial programming state during programming, as individual cells approach the programmed state. In addition, the total bit line current I decreases once some cells from the I/Os are programmed, while some cells remain unprogrammed. Programmed cells appear as open circuits and/or programmed cells are disconnected from node VDQ2 by opening respective switch QPL after programming. As some cells become programmed, the voltage drop across the bit switches 124 and PMOSs QPL does not change on the non-programmed cells, but the voltage (i*Rt) added to VR is reduced because of the reduced value of total current I, thereby undesirably reducing VDQ2. With VDQ2 reduced, local VBL voltages of cells that are still being programmed may not reach their target level. To eliminate this effect, resistor Rt is preferably tunable so that it is responsive to respective cells reaching their programmed state. As current I decreases incrementally with each cell becoming programmed, the resistance of resistor Rt is increased so that a relationship between the variable voltage component VRP and the total bit line current is adjusted to compensate for the lower magnitude of the total bit line current, although the variable voltage component still tracks changes in the total bit line current in real time thereafter. Increasing resistance Rt ensures that the variable voltage component of VRP is not negligible. In one embodiment shown in FIG. 5, each I/O feeds back a signal PDN to represent whether its addressed cell from a selected bit line is in a programmed state (or the bit line has any overased cells during overerase correction). The signals PDN are then used to tune the resistance Rt as shown in FIG. 5. Signal PDN may be generated using reference array 118 and sense amplifiers 116 and techniques described above that sense whether there is bit line current during overerase correction or during programming, or using techniques familiar to those in the art for confirming the programmed state of a cell or the presence of an overerase condition.

The control signals are illustrated in FIG. 5 as PDN[0] through PDN[n] in tuning circuit 500 of Detector and Tuner Circuit 200. Tuning Circuit 500 includes a plurality of parallel resistors R that may be selectively added or removed from the parallel combination by transistor switches triggered by the control signal PDN to change the resistance Rt. As mentioned above, each signal PDN[0] through PDN[N] corresponds to the programmed state of an addressed cell from a selected bit line from a respective I/O or the overerase condition of a bit line from a respective I/O. If a cell from a respective I/O is already in a programmed state (or the bit line does not include any overerased cells), the respective PDN[n] of tuning circuit 500 is set to a low state, thereby opening a respective switch and removing the respective resistor R from the parallel combination of tuning circuit 500 and increasing the resistance of Rt of tuning circuit 500, thereby keeping voltage i*Rt, which still tracks changes in total bit line current I, at a meaningful level despite incremental decreases in total bit line current I as cells become programmed or overerase corrected. In essence, when current i decreases as each cell becomes programmed, resistance Rt increases to maintain the relative magnitude of voltage i*Rt, which in turn effects VRP (i.e., to VR+i*Rt). It is important to note, however, that in the embodiment of FIG. 5, resistance Rt is changed incrementally, not constantly with changes in current I. Once Rt is changed because a cell reaches its programmed state, Rt is fixed until the next cell becomes programmed. VRP continues to track changes in current i at a rate set by the value of Rt until Rt is changed. Once the next cell becomes programmed, the corresponding resistor R is removed from the parallel combination of circuit 500, thereby increasing resistance Rt and the amount that the variable component of VRP tracks real time changes in current i. Increasing resistance Rt incrementally as each cell becomes programmed assures that voltage VRP continues to track changes in total bit line current I in a meaningful way.

Assume, for example, that programming occurs in bytes. If five of eight cells remain to be programmed, then five of eight signals PDN trigger the switches in circuit 500 so that Rt equals the equivalent resistance of five resistors R coupled in parallel. While the five cells are being programmed, VRP, and thus VDQ2, track real time changes in the current I at an amount set by the temporarily fixed value of Rt. Once a cell from the five cells becomes programmed, the corresponding signal PDN opens a switch in circuit 500, thereby increasing the value of equivalent resistance Rt and the amount by which VRP and VDQ2 will track changes in current I for the programming of the remaining four cells. In one embodiment, per the formula derived for Rt above, each resistor R is set equal to M*(Ra/(Ra+Rb))*Req/cell.

As noted above, the bit switch path can be turned off for a programmed cell or I/O by signal PD[n] coupled to the control gate of PMOS QPL. Each signal PD is the inverse state of the respective signal PDN and its logical high is set to VDQ2 and logical low to VSS.

The memory circuit of FIG. 5, although not shown, may still include a leakage path from node VDQ2 to ground as shown in FIG. 2 to reduce any initial overshoot of VDQ2 discussed above in connection with FIG. 2. This current, however, will be mirrored in circuit 200 by the bit line current detector PMOS QP1. The effect of this leakage current can be neutralized by turning on the leakage current circuit for a time interval, for example, 1 μs, to stabilize the VDQ2 level and turning off the leakage current circuit thereafter. A timing circuit (not shown) may be used to control this time duration. The timer that generates control signals for the timing of program pulses, overerase pulses and erase pulses may be used. During this interval, the input to the differential amplifier 122 can be set to VR rather than VRP, essentially disconnecting Detector and Tuner Circuit 200 from differential amplifier 122 and setting VDQ2 to a constant voltage. After this time interval, VRP is connected to the differential amplifier and, optionally, a small leakage path circuit can be turned on to replace the original leakage path circuit for avoiding VDQ2 overshoot. The leakage path circuit may comprise, as one of ordinary skill familiar with the prior art circuit of FIG. 2 will recognize, one or more NMOS transistors coupled in series to node VDQ2. If the voltage at VDQ2 is too high, the current will sink through the NMOS transistors to ground. Once the VDQ2 level is stabilized, the leakage current can be reduced by connecting smaller NMOS transistors to node VDQ2.

Figure 6:
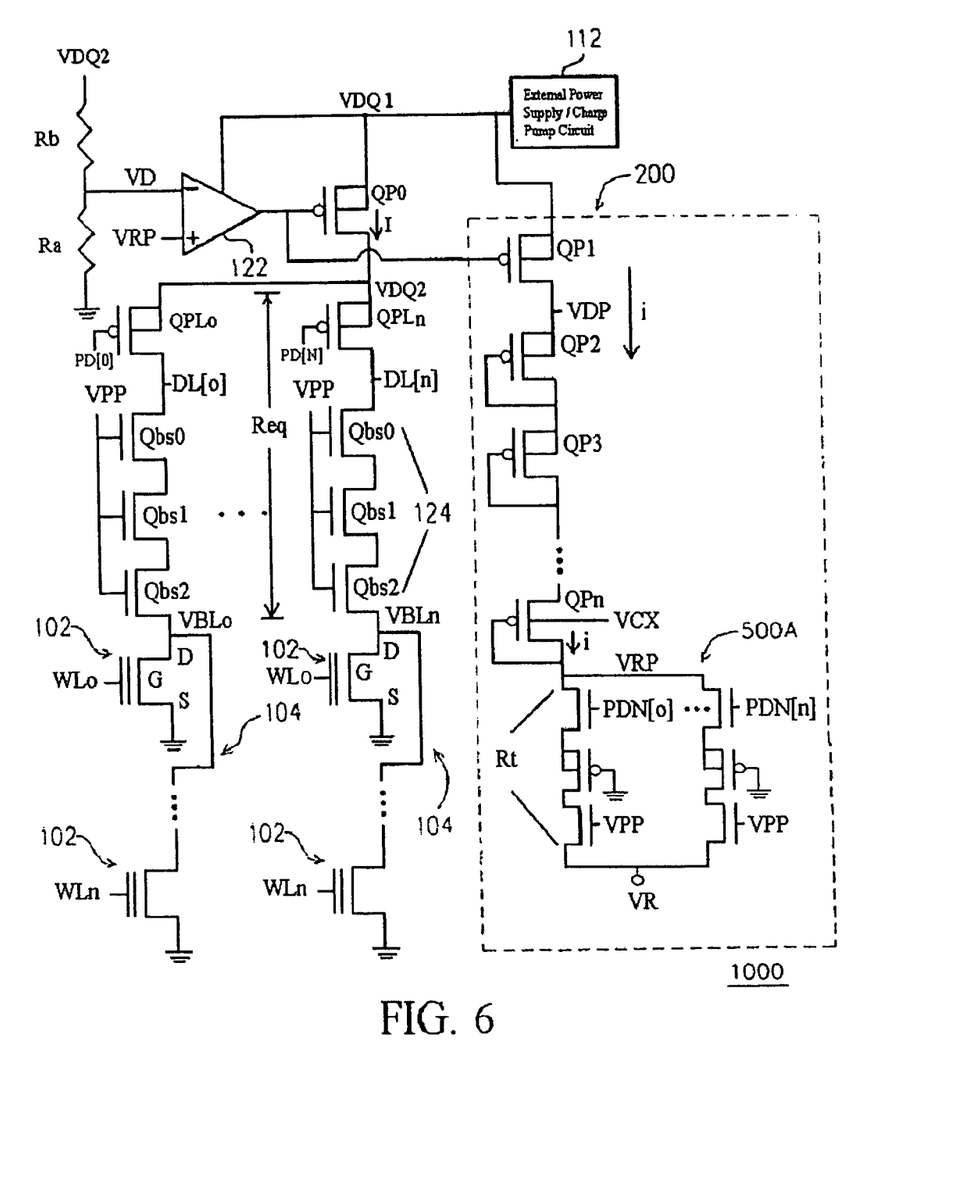

FIG. 6 illustrates that the resistors R in tuning circuit 500A can be implemented as transistors with sizes that conform to the ratio (Ra/(Ra+Rb))*M*the equivalent resistance of transistors of the bit switches 124 and I/O switch QPL of a bit line. This design has advantages in temperature compensation over using resistors, i.e., the transistors have the same temperature coefficient as the transistors in the bit switches.

Tables 1-1 and 1-2 below illustrate the results of a software simulation of the prior art circuit of FIG. 2, where VCC (the power supply voltage), temperature and reference voltage VR are set as indicated. Column "G" indicates the gate voltage at PMOS QP0. The tables illustrate two conditions—(1) there is only one erased cell to be programmed, or one bit line to be overerase corrected, and (2) there are eight erased cells to be programmed or eight bit lines to be overerase corrected. The tables illustrate that the bit line voltage VBL drops between about 0.4 to 0.6 volts compared with the regulated, fixed VDQ2 when between about 2.5–3.3 mA current flows through the bit line or bit lines. The notation "0 mA" represents that all of the cells are in a programmed state.

TABLE 1-1

VCC/Temp = 3.6 V/0° C.; VR = 1.2 V.

| VDQ1 | VDQ2 | No. of I/O to be programmed | total bit line current | G | VDP |
|---|---|---|---|---|---|
| 6 V | 4.67 V | 1 | 0 mA | 5.2 V | 4.09 V |
|  | 4.66 V |  | 0.315 mA | 5.07 V | 4.46 V |
|  | 4.67 V | 8 | 0 mA | 5.2 V | 4.09 V |
|  | 4.66 V |  | 2.53 mA | 4.81 V | 4.91 V |
| 8 V | 4.69 V | 1 | 0 mA | 7.24 V | 4.08 V |
|  | 4.67 V |  | 0.317 mA | 7.10 V | 4.45 V |
|  | 4.69 V | 8 | 0 mA | 7.24 V | 4.07 V |
|  | 4.65 V |  | 2.52 mA | 6.86 V | 4.90 V |

TABLE 1-2

VCC/Temp = 2.5 V/90° C.; VR = 1.2 V.

| VDQ1 | VDQ2 | No. of I/O to be programmed | Total cell current | G | VDP |
|---|---|---|---|---|---|
| 6 V | 4.68 V | 1 | 0 mA | 5.4 V | 3.26 V |
|  | 4.66 V |  | 0.344 mA | 5.22 V | 3.8 V |
|  | 4.68 V | 8 | 0 mA | 5.4 V | 3.26 V |
|  | 4.65 V |  | 2.74 mA | 4.89 V | 4.36 V |
| 8 V | 4.70 V | 1 | 0 mA | 7.44 V | 3.24 V |
|  | 4.67 V |  | 0.344 mA | 7.25 V | 3.75 V |
|  | 4.70 V | 8 | 0 mA | 7.44 V | 3.24 V |
|  | 4.65 V |  | 2.74 mA | 6.94 V | 4.35 V |

Tables 2-1 and 2—2 below illustrate the results of a software simulation of the circuit of FIG. 6, with resistors used to simulate the bit switch resistances. The tables illustrate two conditions—(1) there is only one erased cell to be programmed, or one bit line to be overerase corrected, and (2) there are eight erased cells to be programmed or eight bit lines to be overerase corrected. Tables 2-1 and 2—2 illustrate that the VBL difference when total bit line current is increased is reduced by the change in VRP, and thus VDQ2, as the total bit line current is increased or decreased. The simulation illustrates that the change in VBL due to changes in bit line current is less than or equal to about 0.17 volts for each simulation. The simulation assumed that the temperature coefficient of resistance of Rt is 1000 ppm/0° C. The "VBL" voltage in the chart shows the bit line voltage on a bit line with non-zero bit line current (i.e., on a bit line being programmed or overerase corrected) and for the bit line with zero bit line current and QPL "on". The VBL voltage will be VDQ2 for the bit line with zero bit line current and QPL "on".

TABLE 2-1

VCC/Temp = 3.6 V/0° C.; VR = 1.2 V.

| VDQ1 | VDQ2 | No. of I/O to be programmed | VRP | total bit line current | VBL | G | VDP |
|---|---|---|---|---|---|---|---|
| 6 V | 4.76 V | 1 | 1.22 V | 0 mA | 4.76 V | 5.2 V | 4.12 V |
|  | 5.24 V |  | 1.34 V | 0.33 mA | 4.79 V | 5.05 V | 4.63 V |
|  | 4.68 V | 8 | 1.20 V | 0 mA | 4.68 V | 5.2 V | 4.09 V |
|  | 5.12 V |  | 1.32 V | 2.59 mA | 4.68 V | 4.78 V | 5.0 V |
| 8 V | 4.77 V | 1 | 1.22 V | 0 mA | 4.77 V | 7.23 V | 4.11 V |
|  | 5.23 V |  | 1.34 V | 0.33 mA | 4.78 V | 7.09 V | 4.61 V |
|  | 4.70 V | 8 | 1.20 V | 0 mA | 4.70 V | 7.24 V | 4.08 V |
|  | 5.09 V |  | 1.31 V | 2.61 mA | 4.66 V | 6.84 V | 4.98 V |

TABLE 2-2

VCC/Temp = 2.5 V/90° C.; VR = 1.2 V.

| VDQ1 | VDQ2 | No. of I/O to be programmed | VRP | total cell current | VBL | G | VDP |
|---|---|---|---|---|---|---|---|
| 6 V | 4.76 V | 1 | 1.22 V | 0 mA | 4.76 V | 5.4 V | 3.29 V |
|  | 5.36 V |  | 1.37 V | 0.36 mA | 4.71 V | 5.19 V | 4.02 V |
|  | 4.69 V | 8 | 1.20 V | 0 mA | 4.69 V | 5.4 V | 3.27 V |
|  | 5.14 V |  | 1.36 V | 2.87 mA | 4.65 V | 4.83 V | 4.53 V |
| 8 V | 4.77 V | 1 | 1.22 V | 0 mA | 4.77 V | 7.43 V | 3.27 V |
|  | 5.22 V |  | 1.33 V | 0.36 mA | 4.60 V | 7.24 V | 3.91 V |
|  | 4.71 V | 8 | 1.20 V | 0 mA | 4.71 V | 7.44 V | 3.24 V |
|  | 5.21 V |  | 1.34 V | 2.88 mA | 4.60 V | 6.91 V | 4.47 V |

Tables 2-1 and 2—2 below illustrate the results of a software simulation of the circuit of FIG. 6, with resistors used to simulate the bit switch resistances. The tables illustrate two conditions —(1) there is only one erased cell to be programmed, or one bit line to be overerase corrected, and (2) there are eight erased cells to be programmed or eight bit lines to be overerase corrected. Tables 2-1 and 2—2 illustrate that the VBL difference when total bit line current is increased is reduced by the change in VRP, and thus VDQ2, as the total bit line current is increased or decreased. The simulation illustrates that the change in VBL due to changes in bit line current is less than or equal to about 0.17 volts for each simulation. The simulation assumed that the temperature coefficient of resistance of Rt is 1000 ppm/°C. The "VBL" voltage in the chart shows the bit line voltage on a bit line with non-zero bit line current (i.e., on a bit line being programmed or overerase corrected) and for the bit line with zero bit line current and QPL "on". The VBL voltage will be VDQ2 for the bit line with zero bit line current and QPL "on".

Tables 3-1 and 3-2 below illustrate the results of a software simulation of the circuit of FIG. 6, only using transistors to simulate the bit switch resistances. The tables illustrate two conditions—(1) there is only one erased cell to be programmed, or one bit line to be overerase corrected, and (2) there are eight erased cells to be programmed or eight bit lines to be overerase corrected. Tables 3-1 and 3-2 indicate results that are similar to Tables 2-1 and 2-2 in that VBL stays relatively constant (i.e., the largest change in VBL due to a change in total bit line current was only about 0.2V). The simulation assumed that the temperature coefficient of resistance of Rt is 1000 ppm/°C.

TABLE 3-1

VCC/Temp = 3.6 V/0° C.; VR = 1.2 V.

| VDQ1 | VDQ2 | No. of I/O to be programmed | VRP | total bit line current | VBL | G (gate voltage) | VDP |
|---|---|---|---|---|---|---|---|
| 6.2 V | 4.77 V | 1 | 1.22 V | 0 mA | 4.77 V | 5.36 V | 4.01 V |
|  | 5.37 V |  | 1.38 V | 0.29 mA | 4.97 V | 5.16 V | 4.61 V |
|  | 4.68 V | 8 | 1.20 V | 0 mA | 4.68 V | 5.36 V | 3.98 V |
|  | 5.25 V |  | 1.35 V | 2.28 mA | 4.86 V | 4.74 V | 5.0 V |
| 8 V | 4.80 V | 1 | 1.22 V | 0 mA | 4.80 V | 7.17 V | 3.99 V |
|  | 5.38 V |  | 1.38 V | 0.29 mA | 4.97 V | 6.97 V | 4.61 V |
|  | 4.69 V | 8 | 1.20 V | 0 mA | 4.69 V | 7.17 V | 3.97 V |
|  | 5.24 V |  | 1.35 V | 2.28 mA | 4.85 V | 6.57 V | 4.99 V |

TABLE 3-2

VCC/Temp = 2.5 V/90° C.; VR = 1.2 V.

| VDQ1 | VDQ2 | No. of I/O to be programmed | VRP | total cell current | VBL | G (gate voltage) | VDP |
|---|---|---|---|---|---|---|---|
| 6.2 V | 4.78 V | 1 | 1.22 V | 0 mA | 4.78 V | 5.56 V | 3.11 V |
|  | 5.48 V |  | 1.41 V | 0.31 mA | 4.92 V | 5.30 V | 3.95 V |
|  | 4.69 V | 8 | 1.20 V | 0 mA | 4.69 V | 5.56 V | 3.10 V |
|  | 5.38 V |  | 1.39 V | 2.47 mA | 4.83 V | 4.75 V | 4.47 V |
| 8 V | 4.80 V | 1 | 1.22 V | 0 mA | 4.80 V | 7.38 V | 3.10 V |
|  | 5.56 V |  | 1.42 V | 0.31 mA | 4.98 V | 7.11 V | 4.00 V |
|  | 4.68 V | 8 | 1.20 V | 0 mA | 4.68 V | 7.36 V | 3.10 V |
|  | 5.31 V |  | 1.37 V | 2.48 mA | 4.77 V | 6.59 V | 4.44 V |

Figure 7:
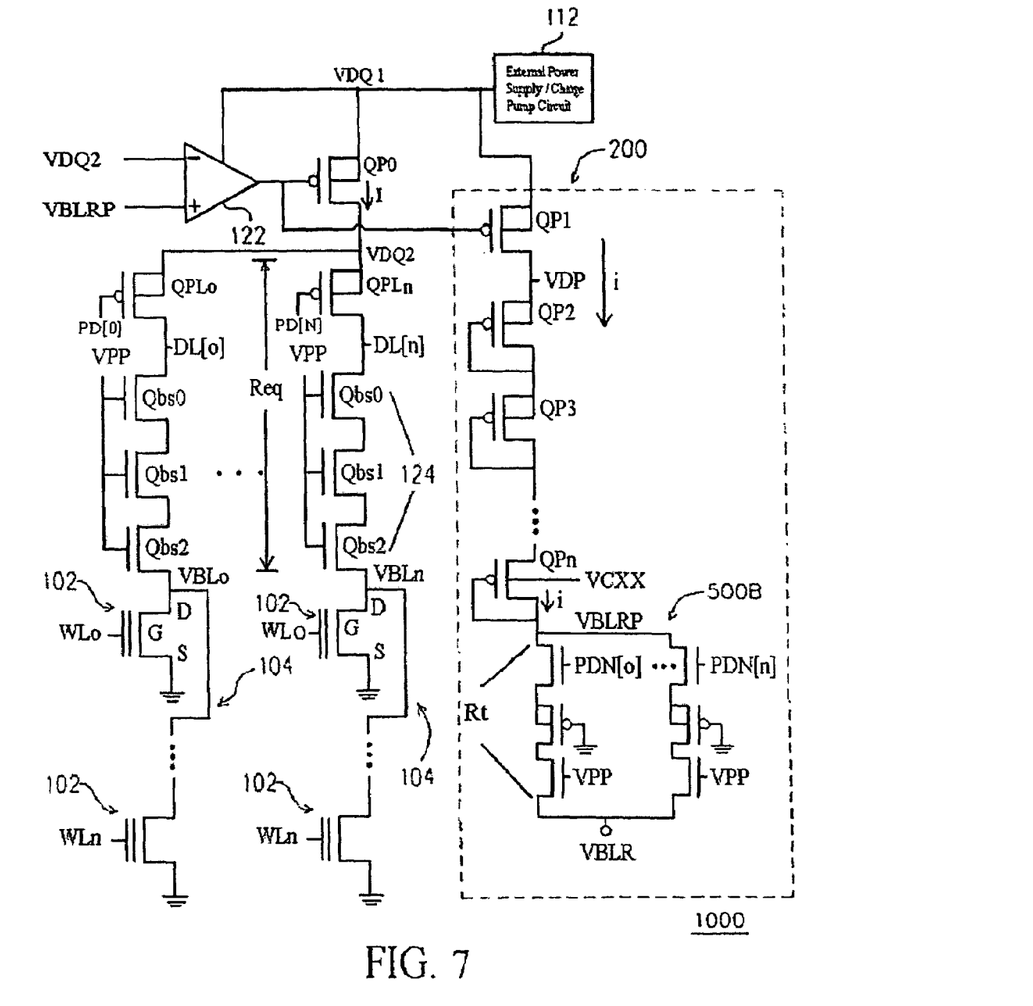

FIG. 7 illustrates another embodiment of a circuit 200 for regulating the voltage VDQ2 dependent on total bit line current. In this embodiment, the positive input to the differential amplifier 122 is coupled to voltage VBLRP. In tuning circuit 500B, VBLR is set to VR*(Ra*Rb)/Ra. VBLRP equals VBLR+i*Rt. The circuit of FIG. 7 uses VDQ2 as the input to the differential amplifier, e.g., VDQ2 is applied to the negative input of the differential amplifier by a feedback connection. This circuit has the same effect on controlling VBL as the circuit of FIG. 6 described above. VBLRP is the reference voltage for generating voltage VDQ2. The resistance to simulate the bit switches is larger than the bit switches resistance by M times rather than M*Ra/(Ra+Rb). The N-well of the PMOS QPn connected to VBLR should have a voltage VCXX higher than VBLR for the reasons described above in connection with voltage VCX of FIG. 6.

From the foregoing, it should be apparent that a circuit and method are provided that make local bit line voltages substantially insensitive to changes in total bit line current by compensating for voltage losses in bit lines, such as losses across bit line switches that activate bit lines, thereby improving programming and overerase correction and cell endurance. In one embodiment, the local bit line voltage VBL varies less than preferably about 0.2V due to changes in the total bit line current provided from the power supply.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A semiconductor memory device, comprising:
   a plurality of bit lines coupled to a supply voltage node, each of said bit lines comprising respective plurality of memory cells coupled to said supply voltage node through a respective bit switch, wherein a group of said memory cells are addressable together for programming or overerase correction;
   means for adjusting a supply voltage at said supply voltage node responsive to a detection of a total bit line current provided to said plurality of bit lines to at least partially compensate for a voltage drop across said bit switches, said voltage drop being dependent at least in part on said total bit line current, said adjustment comprising increasing said supply voltage responsive to a detected increase in said total bit line current and decreasing said supply voltage responsive to a detected decrease in said total bit line current, wherein said adjusting means comprises:
   a differential amplifier having an output coupled to said supply voltage node; and
   a reference voltage generating circuit having an output coupled to a reference voltage input of said differential amplifier, said reference voltage generating circuit comprising a resistance circuit coupled to a current mirror circuit, said current mirror circuit configured to mirror said total bit line current with a reduction ratio.

2. The semiconductor device of claim 1, wherein said adjusting means maintains a bit line voltage at a memory cell from said plurality of memory cells that is substantially constant during programming or overerase correction.

3. The semiconductor memory device of claim 1, wherein said semiconductor memory device is a flash memory device comprising flash memory cells organized in an array of I/O blocks, each I/O block comprising a plurality of columns and plurality of rows, said array of I/O blocks comprising said plurality of bit lines.

4. A semiconductor memory device, comprising:
   a plurality of bit lines coupled to a supply voltage node, each of said bit lines comprising respective plurality of memory cells coupled to said supply voltage node through a respective bit switch, wherein a group of said memory cells are addressable together for programming or overerase correction;
   means for detecting a total bit line current provided to said plurality of bit lines;
   means for adjusting said supply voltage responsive to said detected total bit line current to at least partially compensate for a voltage drop across said bit switches, said voltage drop being dependent at least in part on said total bit line current,
   wherein said supply voltage comprises a fixed reference voltage component and variable voltage component responsive to said detected total bit line current,
   said semiconductor device further comprising means for incrementally adjusting a relationship between said variable component and said total bit line current in response to respective memory cells from said group of memory cells reaching a programmed state,
   wherein said adjusting means comprises a reference voltage generating circuit comprising a tunable resistance circuit coupled to a current mirror circuit, said current mirror circuit configured to mirror said total bit line current with a reduction ratio.

5. The semiconductor device of claim 4, further comprising means for adjusting a resistance of said tunable resistance circuit responsive to a plurality of control signals indicative of whether each of said respective cells from said group of memory cells is in a programmed state.

6. The semiconductor device of claim 5, wherein said relationship is adjusted after each respective cell from said group of memory cells reaches said programmed state.

7. The semiconductor device of claim 4, further comprising means for generating said variable voltage component.

8. The semiconductor memory device of claim 4, wherein said semiconductor memory device is a flash memory device comprising flash memory cells organized in an array of I/O blocks, each I/O block comprising a plurality of columns and plurality of rows, said array of I/O blocks comprising said plurality of bit lines.

9. A semiconductor memory device comprising flash memory cells organized in an array comprising a plurality of columns and plurality of rows, said plurality of columns comprising a plurality of bit lines each comprising a respective one of the memory cells coupled to a supply voltage through a respective bit switch, wherein a group of said memory cells are addressable together for programming, said semiconductor device further comprising:
  means for detecting a total bit line current provided to a plurality of bit lines associated with said group of memory cells;
  a regulated supply voltage source for providing said supply voltage, said supply voltage comprising a fixed reference voltage component and a variable voltage component responsive to said detected total bit line current, wherein said supply voltage is adjusted to track changes in total bit line current provided to said plurality of bit lines associated with said group; and
  means for adjusting, in response to respective memory cells reaching a programmed state, a relationship between said variable voltage component and said total bit line current, said adjusting means comprising a reference voltage generating circuit comprising a tunable resistance circuit coupled to a current mirror circuit, said current mirror circuit configured to mirror said total bit line current with a reduction ratio.

10. The semiconductor device of claim 9, further comprising means for adjusting a resistance of said tunable resistance circuit responsive to a control signal indicative of whether each of said respective cells are in a programmed state.

11. The semiconductor device of claim 10, wherein said relationship is adjusted after each respective cell reaches said programmed state.

12. A semiconductor memory device, comprising:
  a bit line;
  a memory cell and a bit switch coupled between said memory cell and a supply voltage node;
  a current mirror circuit configured to mirror a bit line current through said memory cell with a reduction ratio;
  a voltage source having an output coupled to said supply voltage node and responsive to a reference voltage; and
  a reference voltage generator circuit having an output coupled to a reference voltage input of said voltage source, said reference voltage generator circuit comprising a resistance circuit coupled to said current mirror circuit,
  wherein said reference voltage generator circuit provides a reference voltage for said voltage source that is responsive to said mirrored bit line current,
  whereby said supply voltage at said supply voltage node is adjusted responsive to said bit line current to at least partially compensate for a voltage drop across said bit switch, said voltage drop being dependent at least in part on said bit line current.

* * * * *